United States Patent [19]

Turner et al.

[11] Patent Number: 4,852,044
[45] Date of Patent: Jul. 25, 1989

[54] PROGRAMMABLE DATA SECURITY CIRCUIT FOR PROGRAMMABLE LOGIC DEVICE

[75] Inventors: John E. Turner; Jerome E. Liebler, both of Beaverton, Oreg.

[73] Assignee: Lattice Semiconductor Corporation, Hillsboro, Oreg.

[21] Appl. No.: 236,348

[22] Filed: Aug. 22, 1988

Related U.S. Application Data

[63] Continuation of Ser. No. 707,666, Mar. 4, 1985, abandoned.

[51] Int. Cl.⁴ .............................................. G06F 12/14
[52] U.S. Cl. ................................. 364/900; 364/918.7; 364/969; 364/969.4; 364/716; 340/825.83
[58] Field of Search ... 364/200 MS File, 900 MS File, 364/716; 365/94, 96, 103, 104, 177, 179, 185; 340/825.83, 825.84

[56] References Cited

U.S. PATENT DOCUMENTS

| | | | |
|---|---|---|---|
| 4,037,089 | 7/1977 | Horninger | 364/900 |
| 4,488,267 | 12/1984 | Harrison | 365/201 |
| 4,521,852 | 6/1985 | Guttag | 364/200 |
| 4,521,853 | 6/1985 | Guttag | 364/200 |
| 4,543,646 | 9/1985 | Ambrosius, III et al. | 364/900 |
| 4,583,196 | 4/1986 | Koo | 364/900 |
| 4,590,552 | 5/1986 | Guttag et al. | 364/200 |
| 4,609,986 | 9/1986 | Hartmann et al. | 364/200 |
| 4,617,479 | 10/1986 | Hartmann et al. | 364/900 |
| 4,638,189 | 1/1987 | Geannopoulas et al. | 307/465 |
| 4,652,773 | 3/1987 | Cartwright, Jr. | 307/469 |

*Primary Examiner*—Gareth D. Shaw
*Assistant Examiner*—Kevin A. Kriess
*Attorney, Agent, or Firm*—Marger & Johnson

[57] ABSTRACT

An architecture security fuse circuit is disclosed for securing the architecture of a configurable programmable logic device. The storage element of the circuit is a floating gate transistor cell. Data stored in the cell is determined by the amount of charge trapped within the oxide-isolated polysilicon floating gate region. The security fuse is initialized (erased) during device fabrication to allow access to device architectural data. Such initialization is accomplished by a technique that the device user cannot duplicate, via an extra probe pad accessible only during wafer probe. To deter the effects of floating gate charge loss which may occur during subsequent fabrication steps, the fuse circuit is adapted to provide a reduced memory cell read voltage, thus providing greater margin against thermally defeating the security fuse. A regenerative feature is provided to strengthen the erased cell during every device "clear" cycle. Once the security fuse is programmed, the data defining the device architecture may not be interrogated or altered, and the memory cell is unchanged by the regenerative feature.

16 Claims, 3 Drawing Sheets

PROGRAMMABLE DATA SECURITY CIRCUIT FOR PROGRAMMABLE LOGIC DEVICE

This is a continuation of co-pending application Ser. No. 06/707,666 filed on Mar. 4, 1985, now abandoned.

BACKGROUND OF THE INVENTION

The present invention relates to programmable logic devices (PLDs), and more particularly to techniques for preventing the unauthorized modification of programmed data, such as data defining the architecture of PLDs, in a simple, yet effective manner.

Digital systems such as computers typically are fabricated from many logic and memory integrated circuits. A goal of microelectronic integration is to fit the memory and logic circuits of a system onto the fewest possible integrated circuits, to minimize the cost and increase the system speed and reliability.

Useful memories are relatively easy to define, but logic circuits present a problem to circuit manufacturers, who cannot afford to make logic circuits which are perfectly tailored to the specific needs of every customer. Instead, general purpose integrated circuits are defined which can serve as many roles as possible. For example, the microprocessor allows logic functions to be expressed in software, and together with memory units and standard peripheral devices, is capable of consolidating much of the logic in a digital system. However, random logic circuits are still required to tie these elements of the system together.

Several schemes are used to implement these random logic circuits. One solution is standard logic, such as transistor-transistor logic (TTL). While TTL integrated circuits are versatile because they integrate only a relatively small number of commonly used logic functions, large numbers of TTL circuits are typically required for a specific application.

Other alternatives include fully custom logic circuits and semi-custom logic circuits, such as gate arrays. Custom logic circuits, precisely tailored to the needs of a specific application, allow the implementation of specific circuit architectures, dramatically reducing the number of parts required for a system. However, custom logic devices require significantly greater engineering time and effort.

Semi-custom gate arrays are less expensive to develop and offer faster turnaround because the circuits are typically identical except for a few final-stage steps, which are customized according to the system design specification. However, semi-custom gate arrays are less dense, so that it takes more gate array circuits than custom circuits to implement a given amount of random logic.

Between the extremes of general purpose devices on the one hand and custom and semi-custom gate arrays on the other, are programmable logic devices (PLDs). PLDs provide a flexible architecture, user-programmed through on-circuit fuses or switches, to perform specific functions for a given application. PLDs can be purchased "off the shelf" like standard logic gates, but can be custom tailored like gate arrays.

To use PLDs, system designers draft equations describing how the hardware is to perform, and enter the equations into a PLD programming machine. The unprogrammed PLDs are inserted into the machine, which interprets the equations and provides appropriate signals to the device to blow the appropriate fuses or set the appropriate switches such that the PLD will perform the desired logic function in the user's system. The PLD typically includes hundreds or thousands of the fuses or switches, arranged in one or more matrices to facilitate their manufacture and programming. It is known to employ security fuse circuits in bipolar PLDs which prevent interrogation and alteration of the data programmed into the device AND array.

The PLDs on the market today comprise many different products for performing specific functions. Thus, the PLD manufacturers have heretofore been required to manufacture and inventory each of the products individually. The cost of each of the types of PLDs differs greatly as a function of logic complexity and manufacturability.

The assignee of the present invention has recently developed a novel single-chip PLD employing electrically erasable cells which is capable of being configured (and reconfigured) to a plurality of specific devices by means of programmable architecture bits. Thus, the device can take the place of many other PLDs as a result of its versatility. Yet, while such a versatile product will command a premium price for many applications, in many situations it is desirable to market a less versatile product at a lower price. There is therefore a need to provide a security device, which may not be defeated by the user, allowing the manufacturer to lock a reconfigurable PLD into one specific configuration.

Such a security device could also be employed as a circuit yield enhancement tool. Devices which have manufacturing defects or which cannot meet performance specifications in one or more configurations may be locked into an operable configuration.

It is therefore an object of the invention to provide a programmable architecture security fuse for a reconfigurable PLD which may be set after device fabrication, and thereafter not defeated by the user.

Another object is to provide a one time programmable architecture security circuit which allows the manufacturer of a reconfigurable PLD to configure the device, but thereafter defeats any attempts to alter the PLD architecture.

A further object is to provide a security circuit protecting programmed data which is resistant to inadvertent programming by high temperature charge transfer effects during device fabrication and/or packaging.

Another object is to provide a one time programmable architecture security fuse with a regenerative erase function.

SUMMARY OF THE INVENTION

In accordance with the invention, a security circuit is provided for PLDs. The storage element of the preferred embodiment of the circuit is an electrically erasable, floating-gate-type transistor structure. Thus, the transistor structure may be programmed either to the nonconductive (with the nominal interrogation voltage) enhancement mode or to the conductive depletion mode. With the storage element in the depletion mode, the security circuit protects programmed data such as architecture configuration bits against alteration; conversely, the data may be altered or interrogated (verified) with the circuit in the erased state, i.e., with the storage element erased.

The state of the storage element is determined by the amount of charge trapped within the oxide isolated polysilicon floating gate region of the structure. Since the amount of charge present on the floating gate when the device completes its manufacturing cycle is unknown, the security circuit is initialized (erased) to allow access to protected data such as architectural data. Initialization, which also defeats a programmed cell, is accomplished by a method that the user cannot duplicate, by an extra probe pad accessible only at wafer probe, i.e., prior to device packaging. Following circuit initialization during wafer probe, the device experiences high temperatures during the assembly and packaging operations, resulting in charge loss from the floating gate which could alter the state of the security circuit. To deter the effects of charge loss during assembly, a reduced storage element read (or interrogation) voltage provides greater margin against thermal effects. Additionally, a regenerative feature is included in the fuse circuit to strengthen the erased cell during every user clear cycle, ensuring that an erased cell does not inadvertently flip to the programmed state. Programmed security circuits are unchanged by the regenerative feature.

BRIEF DESCRIPTION OF THE DRAWINGS

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

The present invention comprises a novel security fuse circuit for programmable logic devices. The following description is presented to enable any person skilled in the art to make and use the invention, and is provided in the context of a particular application and its requirements. In the following description numerous specific details are set forth, such as logic circuit and device block diagrams and the like, in order to provide a thorough understanding of the invention. It will be obvious to those skilled in the art that the invention may be practiced without these specific details. In other instances, well-known circuit and device details are not described in detail so as not to obscure the invention.

Figure 1:
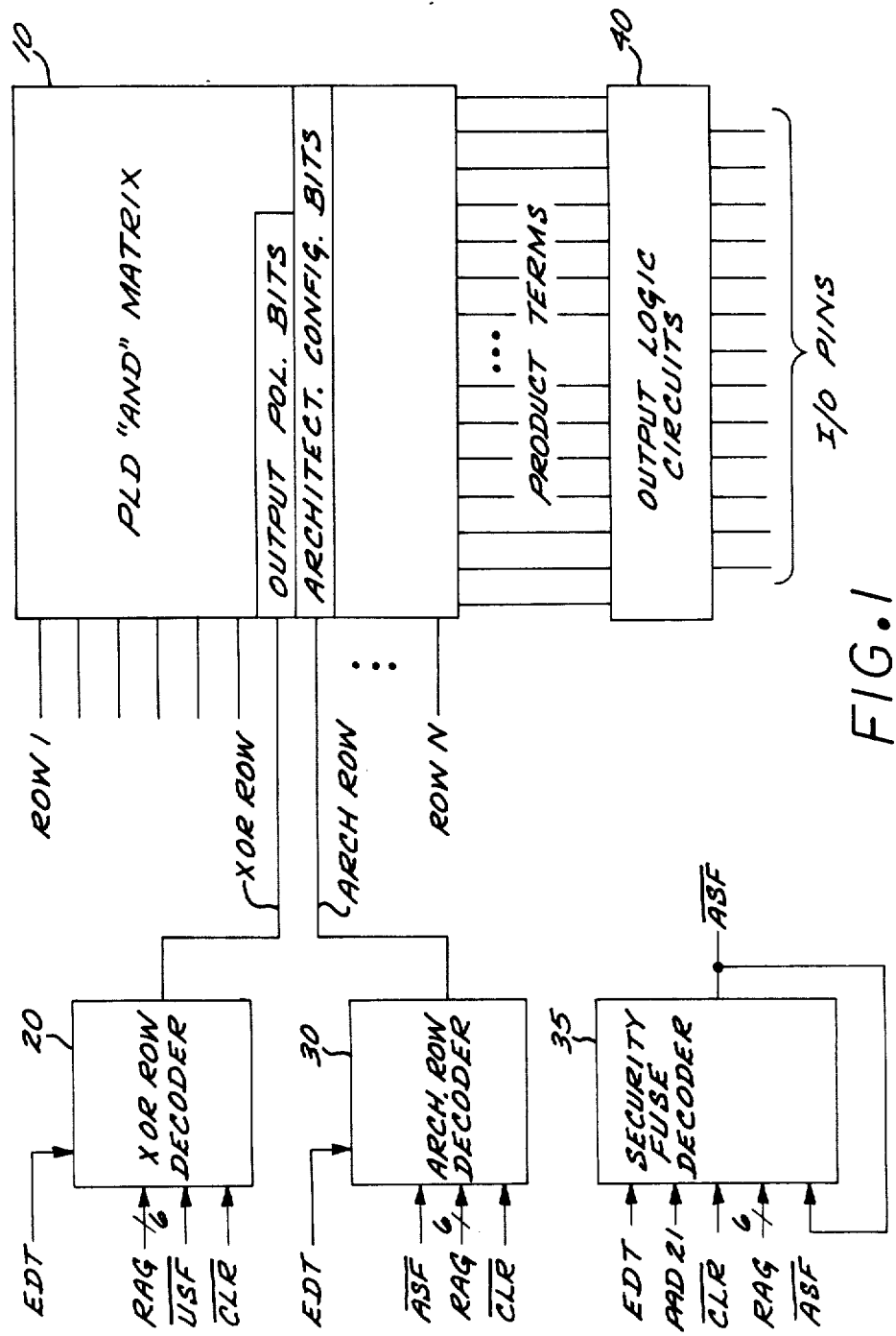
FIG. 1 is a block diagram illustrative of a technique for configuring the architecture of a programmable logic device, incorporating the architecture security fuse of the present invention.

FIG. 1 is a partial block diagram of a PLD incorporating the security fuse circuit in accordance with the present invention. While the preferred embodiment comprises a circuit for protecting programmable data defining the logic architecture of a PLD, it will be appreciated that the invention may be employed generally to protect programmed data of any type in a PLD employing reprogrammable memory cells against interrogation or alteration.

The PLD comprising the circuit is fabricated in CMOS technology, and comprises output circuitry 40 whose architecture is configurable in accordance with certain architecture control bits stored in data storage locations in the PLD. As will be appreciated by those familiar with PLDs, the ability to reconfigure the output circuitry greatly enhances the versatility of the device.

The PLD comprises "AND" matrix 10, having a plurality of memory cells or fuses, as is conventional in the art. The matrix includes a plurality of row input lines 1-N and a plurality of column lines or product terms. Output logic circuitry 40 couples the product terms to the device output pins.

For purposes of describing the preferred embodiment, it may be assumed that the architecture of the PLD is determined by the status of the data bits stored in two rows, the architecture row and the "XOR" row of the array. Specifically, the bits in the XOR row provide the capability of inverting the output lines of the PLD to provide either inverted or noninverted output logic states. Thus, for a PLD having eight output lines, eight bits in the XOR row determine whether an inverter in each output line is activated. Seventy-four data bits in the architecture row determine the architecture of the remaining output circuitry, defining the specific output logic paths and functions to which the PLD is configured. The specific details as to the type and location of the data to be protected are exemplary only, as the invention is not limited to protection of architecture data in a specific location in the PLD.

In the preferred embodiment, the PLD memory cells of the matrix comprise electrically erasable floating gate transistors which may be programmed either into the depletion mode or enhancement mode, wherein the cell is respectively conductive or nonconductive during cell interrogation. The memory cells or bits of each row are programmable in a device "edit" mode by selecting the particular row and applying appropriate programming voltages to the cells in the selected row.

The disclosed PLD is packaged in a 20 pin package, and is operable in the normal user mode, in the device "edit" mode, or in other modes. The edit mode is selected by application of a super voltage (+20 volts) signal to pin 2 of the device. This activates row decoders for each of the rows of the matrix 10, and otherwise reconfigures the device pin functions. In the edit mode, six of the device pins define the six-bit word "RAG" (row address gate) which defines a particular row address. Thus, by way of example, row decoders 20, 30, and 35 decode the particular RAG word selecting the XOR row, the architecture row, and the security fuse circuit, respectively. The inputs to the decoders 20,30 comprise the "RAG" word and the $\overline{CLR}$ signal, which is activated by the user to clear or erase each of the user-accessible memory cell locations in the array. Another input signal to decoder 30 is the $\overline{ASF}$ signal, which is the output of the architecture security fuse circuit.

The architecture security fuse circuit is provided to prevent the device user from accessing the architecture row to interrogate or reprogram the architecture configuration bits. These bits determine the configuration of the output logic circuits 40 and their relationship to the AND matrix. Thus, when the output $\overline{ASF}$ of the architecture security fuse circuit 35 is active, decoder 30 cannot be activated to select the architecture row.

Normal Security Circuit Operation

Figure 2:
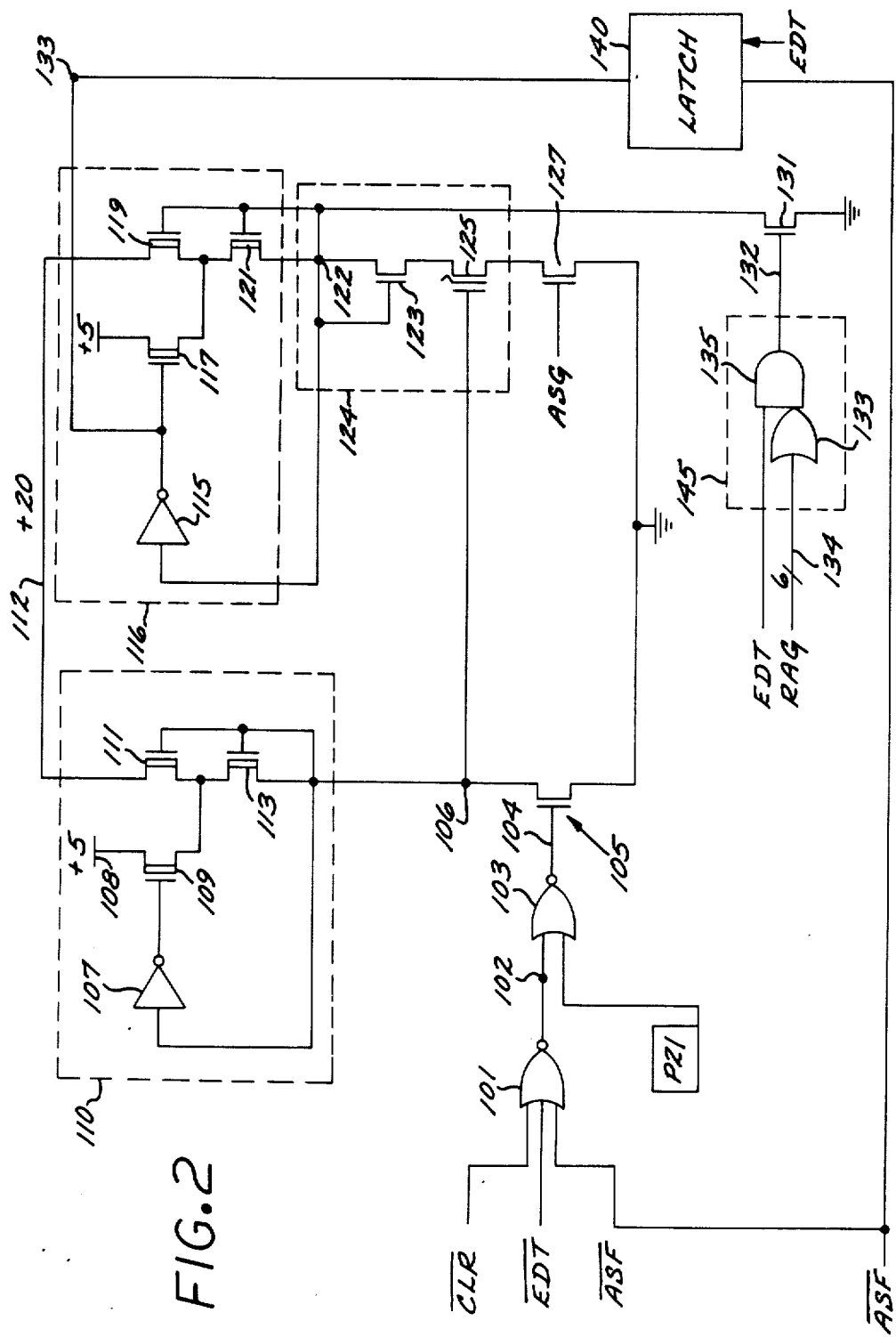
FIG. 2 is a circuit schematic of the presently preferred embodiment of the security fuse.

The preferred embodiment of the architecture security fuse ("ASF") circuit is illustrated in schematic form in FIG. 2. While the PLD is implemented in CMOS technology, the architecture security fuse ("ASF") circuit comprises depletion NMOS-type transistors 109, 111, 113, 117, 119 and 121, which are doped with arsenic so that the threshold turn-on gate voltage is negative.

Transistors 109,111,113 and inverter 107 form a voltage pull-up circuit 110 which is coupled to node 106. Pull-up circuit 110 is adapted to pull node 106 up to the potential on node 112 (+20 volts) when transistor 105 is nonconductive, and to disconnect the +20 volt supply from node 106 when node 106 is grounded, i.e., when transistor 105 is conductive. Similarly, transistors 117,119,121 and inverter 115 form a voltage pull-up circuit 116 which is coupled to node 122. Such pull-up circuits are known to those skilled in the art and need not be described further.

Transistor 125 is the data storage element of the ASF circuit, and is a floating gate, N channel field effect transistor. The floating gate transistor is a well-known memory element, and its characteristics are discussed, for example, in the book "Physics of Semiconductor Devices," by S.M. Sze, John Wiley & Sons, 1969, at Chapter 10. The floating gate transistor in the preferred embodiment is adapted to employ the well-known Fowler-Nordheim tunneling effect to configure the transistor in the enhancement or depletion mode. The floating gate is separated from the drain region comprising the transistor by a thin (100 Angstrom) oxide layer, so that in the presence of a sufficient electric field, charge will tunnel between the drain and the floating gate. Such memory elements are commonly used in electrically erasable memories and need not be described in further detail.

As will be described more fully below, when the floating gate transistor is "erased," i.e., programmed to the enhancement mode (nonconductive), the fuse circuit output $\overline{ASF}$ is low, permitting the PLD architecture row data to be interrogated or altered. When the floating gate transistor is programmed to the depletion mode (conductive), however, the circuit output $\overline{ASF}$ will be high to prevent the PLD architecture configuration bits from being interrogated or altered.

The inputs to NOR gate 101 are the $\overline{CLR}$ and $\overline{EDT}$ signals, and the output $\overline{ASF}$ of the fuse circuit. The output of NOR gate 101 will be high only when all inputs to the gate are low. The output of NOR gate 101 at node 102 is coupled as one input to NOR gate 103. The other input to NOR gate 103 is node "P21." This node is buffered from a wafer probe pad which is accessible to wafer probe only prior to chip packaging.

As will be discussed below, node P21 provides an override function to force transistor 105 to the nonconductive state and cause node 106 to be pulled high. This results from the operation of NOR gate 103, since if P21 is forced high, the NOR gate output at node 104 will be low, irrespective of the state of the other gate input.

When node P21 is low, NOR gate 103 acts to invert the signal at node 102, the output of NOR gate 101. This effectively creates a logical OR function, so that with P21 low, the status of node 104 is the logical OR of $\overline{CLR}$, $\overline{EDT}$, and $\overline{ASF}$.

The output 104 of gate 103 is coupled to the gate of transistor 105, and when "high" biases the transistor to the conductive state. Node 106, coupled to the gates of transistor 125,113 and to pull-up circuit 110, will then be grounded.

If the output of gate 103 is low, transistor 105 will be nonconductive and node 106 is not clamped to ground, and the potential at node 106 is pulled up to +20 volts by circuit 110.

With the condition that transistor 105 is conductive, pull-up circuit 116 operates in a similar manner with respect to node 122 as described with respect to circuit 110 and node 106. However, for node 122 there are two possible paths to ground, the first path through transistors 123, 125, and 127, and the second path through transistor 131.

Transistor 123 is connected for diode operation, and is employed with transistor 125 to create an electrically erasable, programmable data storage cell 124. Interrogation of the status of memory cell 124 is performed by inverter 115, and occurs when node 106 is grounded (transistor 105 in the conductive state), transistor 127 is conductive (signal "ASG" applied to its gate is at +2.5 volts) and transistor 131 is nonconductive (with its gate at ground). The status of node 122 will depend on the state of memory cell 124. If the floating gate transistor 125 is erased, so that it is in the enhancement mode, transistor 125 will be nonconductive. Node 122 will be pulled high, and the output of inverter 115, at node 133, will be low.

If, on the other hand, transistor 125 is programmed to the depletion mode, the transistor will be in the conductive state with its gate grounded. With transistor 127 also conducting, node 122 will be low. Under these conditions, the output of inverter 115 at node 133 will be high.

Node 133 at the output of inverter 115 is coupled to latch 140. The output of latch 140 is the ASF circuit output signal $\overline{ASF}$, which is coupled to the input of NOR gate 101. Except when signal EDT is active, latch 140 is transparent to the state of node 133, and the state of $\overline{ASF}$ is identical to the state at node 133. When EDT goes high the $\overline{ASF}$ is latched to its then current state, and is not affected by changes in the state at node 133 while EDT is high.

Figure 4:
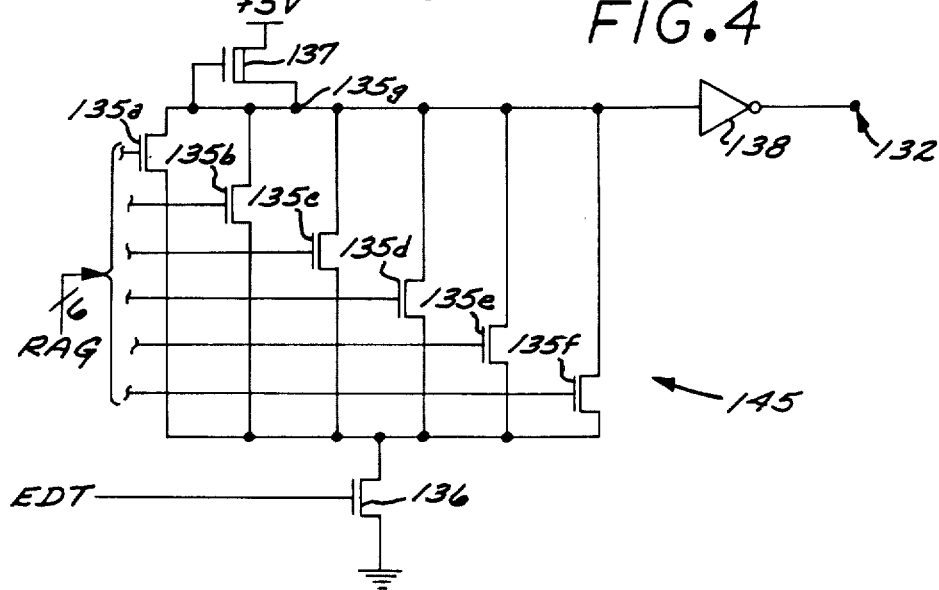

The row decoder 145 for selecting the security fuse row is shown in schematic form in FIG. 4. Depletion transistor 137 performs a voltage pull-up function on node 135g when the node is not clamped to ground through transistor 136 and any of transistors 135a–f. Inverter 138 inverts the state of node 135g. Thus, when the security fuse row is selected, each of transistors 135a–f is turned off, transistor 137 pulls up the voltage on node 135g, and node 132 goes low, turning off transistor 131. When the security fuse row is not selected and when EDT is high, node 135g is clamped to ground, node 132 goes high, and transistor 131 is turned on.

Architecture Row Decoder

Figure 3:
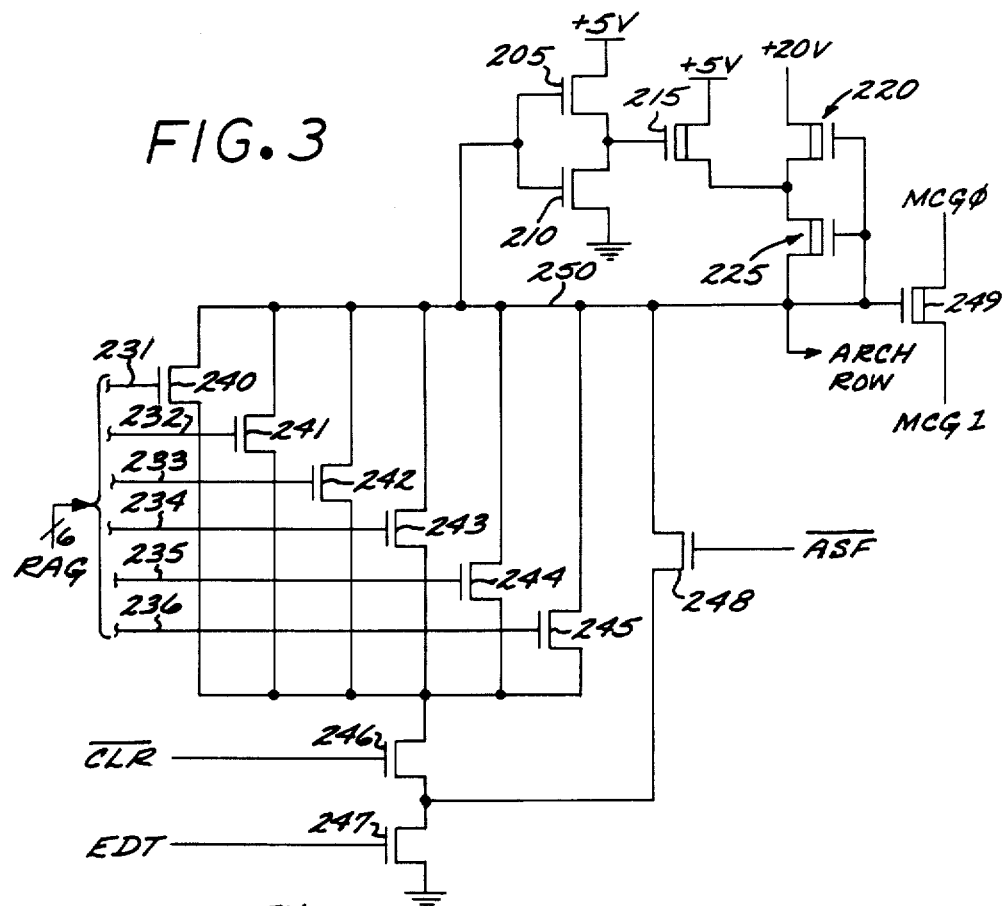
FIGS. 3 and 4 are schematic drawings of two row decoder logic circuits employed in the preferred embodiment.

FIG. 3 is a schematic drawing of architecture row decoder 30. The decoder essentially performs a NOR function on the RAG (row address gate) and EDT signals. The transistors 205, 210 and depletion transistors 215, 220, 225 form a high voltage pull-up circuit similar to that formed, for example, by transistors 117, 119, 121 shown in FIG. 2. That is, when no path to ground from node 250 exists, the voltage pull-up circuits pull the voltage at node 250 up to a high level.

In the edit mode, EDT is high, turning on transistor 247. Except when performing a "bulk erase" cycle, $\overline{CLR}$ is high, turning on transistor 246. However, because each of transistors 240–245 is turned off when the appropriate RAG word is selected, there is no path to ground from node 250 through transistor 246. Hence, unless transistor 248 is turned on, node 250 will be pulled high. Node 250 is coupled to each of the select gates comprising the memory cells in the architecture row, thereby selecting each of the memory cells in that row. The high potential at node 250 also turns on transistor 249, which couples the MCGφ signal to node MCG1, coupled to the gates of the floating transistor memory elements of the matrix. The MCGφ signal is at the appropriate voltage level (+2.5 v) for interrogation of the user array memory elements. Thus, a high signal at node 250 serves to select the memory cells of the architecture row.

If $\overline{ASF}$ is low, i.e., the architecture security fuse is erased, then transistor 248 is turned off, allowing node 250 to be pulled high. However, if the fuse is programmed, $\overline{ASF}$ is high, turning on transistor 248. Node 250 is then clamped to ground through transistors 248 and 247, preventing the memory cells in the architecture row from being selected, irrespective of the status of the RAG word.

During the PLD bulk erase cycle, $\overline{CLR}$ goes low, turning off transistor 246. Then node 250 will be pulled high, unless $\overline{ASF}$ is high, irrespective of the state of the RAG word. However, the security fuse signal $\overline{ASF}$ will defeat the bulk erase cycle for the architecture row, i.e., if $\overline{ASF}$ is high.

Fuse Circuit Initialization

During the wafer probe stage of the PLD chip fabrication, node P21 is forced "high" from an extra probe pad. (Once the chip has been packaged in a twenty-pin package, this extra pad is not accessible.) The output of NOR gate 103 is low unless both inputs are low. Hence, with one input (P21) to NOR gate 103 forced high, its output will be low, driving the gate of transistor 105 low so that the transistor becomes non-conductive.

With transistor 105 non-conductive, node 106 is no longer clamped to ground, and as the potential on node 106 is pulled up as discussed above, the output of inverter 107 is flipped low, turning off transistor 109. Transistor 111 turns on, and with both transistors 111, 113 turned on, the voltage at node 106 rises to +20 volts. Under these conditions, during the device edit mode floating gate transistor 125 may be "erased" to the enhancement mode by turning on transistors 127 and 131. The ASG signal at the gate of transistor 127 is brought to 5 volts to turn on transistor 127. The EDT signal is high during the edit mode; the security fuse row is not selected so that the gate of transistor 131 is brought high, as discussed above, turning on transistor 131. With both the drain and source of transistor 125 coupled to ground potential through conductive transistors 127,131, and its gate at +20 volts, electrons will tunnel from the drain onto the floating gate, programming the transistor to a strong enhancement mode, wherein a positive threshold gate voltage of at least 6-7 volts is required to turn on the transistor in this mode. Since the gate of transistor 125 is grounded during interrogation, the transistor will be nonconductive. Node 122 is pulled high, and the output of inverter 115 at node 133 goes low. The architecture security fuse is then erased.

Fuse Circuit Programming

The architecture security fuse circuit is accessed by addressing the security fuse row. This row must be selected as described above in order to program the fuse. This turns transistor 131 off, so that there is no path to ground from node through transistor 131.

To program the transistor 125 to the depletion mode, node 106 is brought low by turning on transistor 105. This will normally be done only after the PLD has been packaged, so that pad P21 is no longer accessible. The $\overline{EDT}$ signal is low during the edit mode. However, $\overline{CLR}$ is low only during the user clear cycle, and it is otherwise high. Thus, with the $\overline{CLR}$ input to gate 101 high, the output of gate 101 will be driven low. With both inputs to NOR gate 103 low, the output of NOR gate 103 is driven high, turning on transistor 105, and grounding the gate of transistor 125. Similarly, signal ASG is brought low, turning off transistor 127.

With these conditions, the potential at node 122 will rise due to the pull-up action of transistors 119, 121. Inverter 115 will flip low as the potential at node 122 rises, turning off transistor 117, so that node 122 rises to +20 volts. With the gate of transistor 125 grounded and the drain at +20 volts less the enhancement threshold voltage of device 123, or about 18 volts, electrons will tunnel off the floating gate to the drain, programming the transistor to the depletion mode. In this mode, the transistor will conduct when its gate is grounded and when sensed by inverter 115, coupling node 122 to ground. With its input at ground, the inverter output goes high.

The inverter output is coupled to latch 140, which is adapted to latch the existing input state to its output ($\overline{ASF}$) when EDT is high, during the edit mode. When EDT is low, the latch is transparent. The latch prevents the $\overline{ASF}$ signal from changing to the high state during the edit mode, since transistor 131 will be conductive during the edit mode except when the security fuse row is selected. With transistor 131 conductive, node 122 is clamped to ground, flipping the inverter 115 output high. Without the latch, the $\overline{ASF}$ signal would go high during the PLD edit mode, preventing access to the architecture row data even when the memory element of the ASF circuit is erased.

This $\overline{ASF}$ high condition prevents future regenerative erases, and is used in the architecture row decoder to prevent alteration of the architecture word. It is noted that the security fuse circuit can be repeatedly programmed after an initial programming, i.e., with $\overline{ASF}$ high. This reprogramming can be performed to ensure that the fuse remains set to the programmed state. The security fuse circuit may not be erased, however, once the fuse circuit is set.

Post-Assembly Regenerative Erase

With the fuse "erased," the PLD architecture may be configured (or reconfigured) from its existing logic configuration. It is important to ensure that the "erase" status of the security fuse not degenerate resulting from charge loss from the floating gate, preventing the user from programming the device architecture. This is accomplished by post-assembly regenerative erase, which occurs when all inputs to NOR gate 101 are low, that is, when $\overline{ASF}$ is low (erased), the device is in the "clear" mode ($\overline{EDT}=\overline{CLR}=0$), and transistor 131 is turned on (i.e., the security fuse row is not selected). When these conditions are met, node 102 goes high, turning off transistor 105, allowing node 106 to be pulled high to +20 volts, thereby erasing the cell to its full enhancement mode floating gate potential.

The regenerative erase occurs each time the "user clear" device function is selected, provided $\overline{ASF}$ is not high. The PLD is adapted to allow the user to erase all memory locations during a "bulk erase" cycle; during this cycle $\overline{EDT}$ and $\overline{CLR}$ are both low. The regenerative erase does not erase a programmed security fuse cell, since $\overline{ASF}$ is high in this state, and the gate 101 output will remain low. With both inputs to gate 103 low, its output is high, turning on transistor 105 and grounding the gate of floating gate transistor 125. Since the gate must be elevated to the high programming voltage to program the transistor to the enhancement mode, the memory cell is not erased. Thus, the regenerative erase function only affects an erased architecture security fuse circuit.

Reduced Interrogation Voltage

Further margin against charge loss resulting from high temperature packaging steps is provided by reducing the read or interrogation voltage of the memory cell. The PLD is typically packaged with the architecture security fuse memory cell as an erased bit. The manufacturer, for example, may thereafter program the architecture to a desired configuration, and then set the security fuse, which prevents any further manipulation of the protected architecture bits. The memory cell 124 of the architecture security fuse circuit is read or interrogated with its gate at ground potential, instead of the +2.5 volts gate potential nominally employed to read memory cells of this type. As charge loss from the floating gate occurs with the device in the enhancement mode, the required threshold gate voltage required to turn on the transistor is reduced. Thus, reducing the cell interrogation voltage from +2.5 volts to 0 volts provides additional margin against the high temperature induced charge loss.

After the PLD has been packaged and the fuse has been programmed, there is no way to erase the fuse. The circuit logic prevents the storage transistor 125 from being erased whenever the security fuse is set, i.e., whenever $\overline{ASF}$ is high. This follows from the operation of NOR gate 101 and its inputs as discussed above. Thus, the preferred embodiment of the security fuse is an effective one-time programmable circuit. (The fuse can be reprogrammed repeatedly after packaging, but may not be erased once programmed.)

There has been described above a novel security circuit for protecting programmed data in a PLD against unauthorized interrogation or alteration. It is understood that the above-described embodiment is merely illustrative of the many possible specific embodiments which can represent principles of the present invention. Numerous and varied other arrangements can readily be devised in accordance with these principles by those skilled in the art without departing from the spirit and scope of the invention.

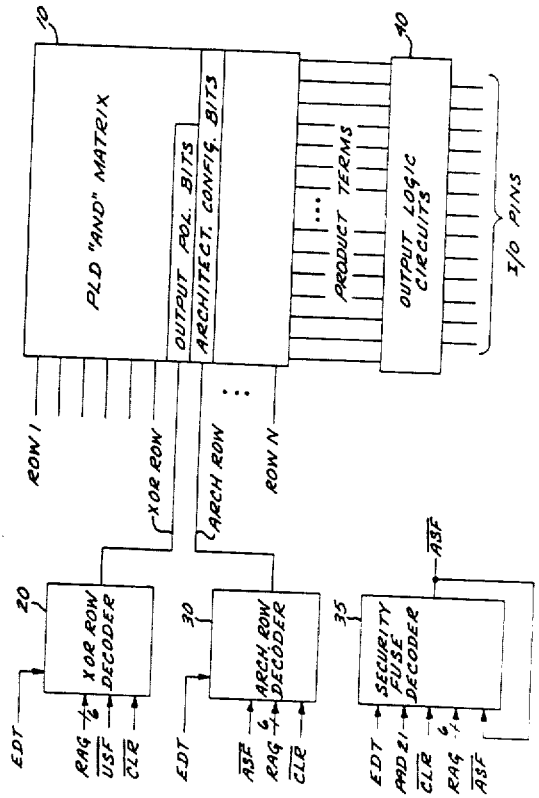

What is claimed is:

1. A security circuit for preventing the erasure, programming, or interrogation of predetermined electrically erasable memory cells in an integrated circuit programmable logic device when such programmable logic device is in an edit mode wherein selected electrically erasable cells of the programmable logic can be erased, programmed, or interrogated, comprising:
   electrically erasable means for storing security data having first and second states;
   latching means responsive to said security data for providing a latching means output having first and second states, said latching means output having the same state as said security data except during the edit mode when said latching means output is latched to the same state of said security data prior to the programmable logic device being in the edit mode;
   programming means responsive to control signals and said latching means output for electrically erasing said electrically erasable means to initialize said security data to said first state and for programming said security data to said second state in a selected edit mode, said programming means being disabled from resetting said security data to said first state after said security data is programmed to said second state; and
   means for disabling access to the predetermined electrically erasable memory cells in response to said second state of said latching means output when the programmable logic device is in the edit mode.

2. The security circuit of claim 1 wherein said electrically erasable means comprises a floating gate transistor.

3. The security circuit of claim 1 wherein said programming means includes means for enabling the initialization of said security data to said first state, said initialization enabling means being disabled after the programmable logic device is packaged.

4. The security circuit of claim 3 wherein said enabling means comprises an extra wafer probe pad which is inaccessible after the programmable logic device is packaged.

5. The security circuit of claim 3 wherein said programming means further includes gating means responsive to said security data replica and said enabling means.

6. The security circuit of claim 1, wherein said disabling means comprises an address decoder.

7. The invention of claim 1 wherein said programming means further selectively and regeneratively erases said electrically erasable means when the programmable logic device is being programmed in the edit mode and when the security data is in said first stage.

8. The invention of claim 1 further comprising means for reading the state of said security data, said reading means being adapted to provide margin against high temperature charge loss effects.

9. A security circuit for preventing the erasure, programming, or interrogation of predetermined electrically erasable memory cells in an integrated circuit programmable logic device when such programmable logic device is in an edit mode wherein selected electrically erasable cells of the programmable logic can be erased, programmed, or interrogated, comprising:
   electrically erasable means for storing security data having first and second states;
   programming means responsive to control signals and said security data for electrically erasing said electrically erasable means to initialize said security data to said first state and for programming said security data to said second state in a selected edit mode, said programming means being disabled from resetting said security data to said first state after said security data is programmed to said second state; and
   means for disabling access to the predetermined electrically erasable memory cells in response to said second state of said security data when the programmable logic device is in the edit mode.

10. The security circuit of claim 9 wherein said electrically erasable means comprises a floating gate transistor.

11. The security circuit of claim 9 wherein said programming means includes means for enabling the initialization of said security data to said first state, said initialization enabling means being disabled after the programmable logic device is packaged.

12. The security circuit of claim 11 wherein said enabling means comprises an extra wafer probe pad which is inaccessible after the programmable logic device is packaged.

13. The security circuit of claim 11 wherein said programming means further includes gating means responsive to said security data and said enabling means.

14. The security circuit of claim 9 wherein said disabling means comprises an address decoder.

15. The invention of claim 9 wherein said programming means further selectively and regeneratively erases said electrically erasable means when the programmable logic device is being programmed in the edit mode and when the electrically erasable means is in said first state.

16. The invention of claim 9 further comprising means for reading the state of said security data, said reading means being adapted to provide margin against high temperature charge loss effects.

* * * * *

UNITED STATES PATENT AND TRADEMARK OFFICE
CERTIFICATE OF CORRECTION

PATENT NO. : 4,852,044
DATED : July 25, 1989
INVENTOR(S) : John E. Turner and Jerome E. Liebler It is certified that error appears in the above-identified patent and that said Letters Patent is hereby corrected as shown below:

On the cover page:

In References Cited - U.S. PATENT DOCUMENTS, add the following references:

--4,698,750   10/87   Wilkie et al..... 364/200

4,603,381   7/86    Guttag.......... 364/200

4,430,709   2/84    Schleupen........364/200

4,295,041   10/81   Ugon.............234/487--.

Replace the drawing with Fig. 1 of the drawings filed in the application.

Signed and Sealed this

Twenty-second Day of May, 1990

Attest:

HARRY F. MANBECK, JR.

*Attesting Officer*      *Commissioner of Patents and Trademarks*

United States Patent [19]
Turner et al.

[11] Patent Number: 4,852,044
[45] Date of Patent: Jul. 25, 1989

[54] PROGRAMMABLE DATA SECURITY CIRCUIT FOR PROGRAMMABLE LOGIC DEVICE

[75] Inventors: John E. Turner; Jerome E. Liebler, both of Beaverton, Oreg.

[73] Assignee: Lattice Semiconductor Corporation, Hillsboro, Oreg.

[21] Appl. No.: 236,348

[22] Filed: Aug. 22, 1988

Related U.S. Application Data

[63] Continuation of Ser. No. 707,666, Mar. 4, 1985, abandoned.

[51] Int. Cl.[4] .............................................. G06F 12/14
[52] U.S. Cl. ............................... 364/900; 364/918.7; 364/969; 364/969.4; 364/716; 340/825.83
[58] Field of Search ... 364/200 MS File, 900 MS File, 364/716; 365/94, 96, 103, 104, 177, 179, 185; 340/825.83, 825.84

[56] References Cited

U.S. PATENT DOCUMENTS

| | | | |
|---|---|---|---|
| 4,037,089 | 7/1977 | Horninger | 364/900 |
| 4,488,267 | 12/1984 | Harrison | 365/201 |
| 4,521,852 | 6/1985 | Guttag | 364/200 |
| 4,521,853 | 6/1985 | Guttag | 364/200 |
| 4,543,646 | 9/1985 | Ambrosius, III et al. | 364/900 |
| 4,583,196 | 4/1986 | Koo | 364/900 |
| 4,590,552 | 5/1986 | Guttag et al. | 364/200 |
| 4,609,986 | 9/1986 | Hartmann et al. | 364/200 |
| 4,617,479 | 10/1986 | Hartmann et al. | 364/900 |
| 4,638,189 | 1/1987 | Geannopoulas et al. | 307/465 |
| 4,652,773 | 3/1987 | Cartwright, Jr. | 307/469 |

Primary Examiner—Gareth D. Shaw
Assistant Examiner—Kevin A. Kriess
Attorney, Agent, or Firm—Marger & Johnson

[57] ABSTRACT

An architecture security fuse circuit is disclosed for securing the architecture of a configurable programmable logic device. The storage element of the circuit is a floating gate transistor cell. Data stored in the cell is determined by the amount of charge trapped within the oxide-isolated polysilicon floating gate region. The security fuse is initialized (erased) during device fabrication to allow access to device architectural data. Such initialization is accomplished by a technique that the device user cannot duplicate, via an extra probe pad accessible only during wafer probe. To deter the effects of floating gate charge loss which may occur during subsequent fabrication steps, the fuse circuit is adapted to provide a reduced memory cell read voltage, thus providing greater margin against thermally defeating the security fuse. A regenerative feature is provided to strengthen the erased cell during every device "clear" cycle. Once the security fuse is programmed, the data defining the device architecture may not be interrogated or altered, and the memory cell is unchanged by the regenerative feature.

16 Claims, 3 Drawing Sheets